United States Patent [19]

Mituhashi et al.

[11] 4,327,247

[45] Apr. 27, 1982

[54] PRINTED WIRING BOARD

[75] Inventors: Kazuyuki Mituhashi, Ohmihachiman; Kunio Matumoto, Hikone; Haruo Shirai; Yoshikatu Tanaka, both of Kyoto, all of Japan

[73] Assignees: Shin-Kobe Electric Machinery Co., Ltd., Tokyo; Shirai Eenshi Kogyo Co., Ltd., Kyoto, both of Japan

[21] Appl. No.: 95,323

[22] Filed: Nov. 19, 1979

Related U.S. Application Data

[63] Continuation-in-part of Ser. No. 947,480, Oct. 2, 1978, abandoned.

[51] Int. Cl.³ .............................................. H05K 1/14
[52] U.S. Cl. .................................................. 174/68.5
[58] Field of Search ........................................ 174/68.5

[56] References Cited

U.S. PATENT DOCUMENTS

| | | | |
|---|---|---|---|
| 3,319,317 | 5/1967 | Roche | 156/656 |
| 3,606,677 | 9/1971 | Ryan | 174/68.5 X |
| 3,628,999 | 12/1971 | Schneble | 427/97 |
| 3,702,284 | 11/1972 | Markenschlager | 427/97 X |
| 3,932,932 | 1/1976 | Goodman | 174/68.5 X |
| 3,999,004 | 12/1976 | Chirino | 427/97 X |
| 4,017,968 | 4/1977 | Weglin | 427/97 X |
| 4,024,629 | 5/1977 | Lemoine | 427/97 X |
| 4,030,190 | 6/1977 | Varker | 174/68.5 X |
| 4,054,483 | 10/1977 | Peiffer | 427/97 X |
| 4,118,523 | 10/1978 | Bingham | 427/97 |
| 4,170,819 | 10/1979 | Peter | 174/68.5 X |
| 4,173,745 | 11/1979 | Saunders | 174/68.5 X |
| 4,230,385 | 10/1980 | Ammon | 174/68.5 X |

OTHER PUBLICATIONS

Tomsu et al., IBM Technical Disclosure Bulletin, V. 21 #4 Sep. 1978 pp. 1396-1397.

*Primary Examiner*—Richard R. Kucia
*Attorney, Agent, or Firm*—Pearne, Gordon, Sessions, McCoy & Granger

[57] ABSTRACT

This invention relates to a printed wiring board having two electrically conductive circuit layers on an insulating laminate. The insulating laminate includes a first insulating layer having a thickness of 0.01 to 0.5 mm, and metal foils are provided on both sides of the first insulating layer. Metal foil circuit layers of predetermined patterns are formed by printing and etching the metal foils. Thereafter, through holes are formed in the first insulating layer across the facing metal foil circuit layers, and then electrically conductive members are applied over the through holes and the metal foil circuit layers at their ends. After that, a second insulating layer is attached onto one of the sides of the first insulating layer on which the connected metal foil circuit layers are provided.

7 Claims, 10 Drawing Figures

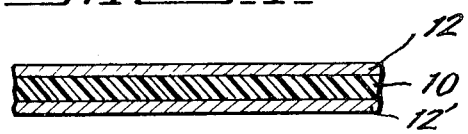
 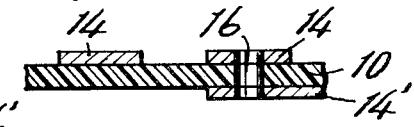
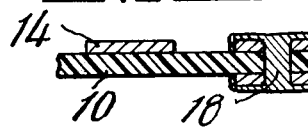 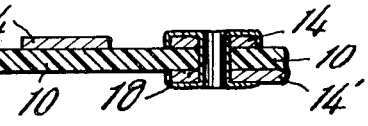
 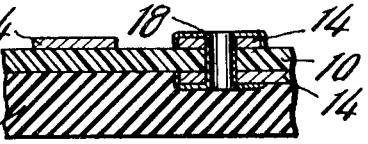
 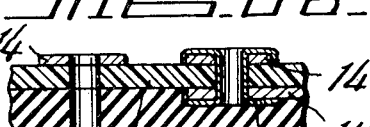
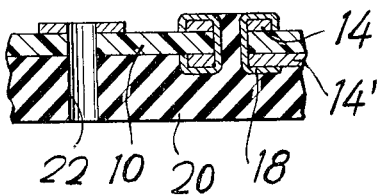

PRINTED WIRING BOARD

BACKGROUND OF THE INVENTION

This is a continuation-in-part of our U.S. application Ser. No. 947,480, filed Oct. 2, 1978, now abandoned.

In the prior art, in order to produce a printed wiring board having two electrically conductive circuit layers, an insulating laminate has been used normally having a thickness of 1.6 mm or more or less. Through holes are provided through the insulating laminate over both electrically conductive metal foil layers which are lined on the laminate, and then the metal foil layers are connected to each other by electroless copper plating or electrical copper plating on the walls of the through holes. Thereafter, plating resists are printed on the metal foils on the insulating laminate, in a pattern complementary to the predetermined pattern of the desired circuits, and then solder electroplating layers or gold plating layers are provided at the areas of the laminate where the plating resists are not provided. After that, the plating resists are removed and then solder electroplating or gold plating layers are treated so as to have a resistance to etching. Thus, the exposed copper plating portions and the underside copper foil layer portions are removed by etching. Thus, a complete printed wiring board is produced having two electrically conductive circuit layers provided, one on each side of the board.

This process, however, is complicated and, in addition, requires high technology because the two electrically conductive circuit layers have to be connected to each other by the plating layers extending through the thick insulating layer or laminate (board). It should be noted that the thickness of the copper plating layers has to be more than 25 microns in view of a change in the thickness of the insulating laminate due to its heat expansion, and that the copper plating layer has to be carefully made so as to have a ductility enough to follow the expansion and contraction of the laminate because the ductility of plated copper depends on the plating conditions such as the density of current, the bath temperature, and the bath composition. Thus, high technology is required for electrical connection between the metal foil circuit layers at both sides of the laminate. Furthermore, gold or solder electroplating layers have to be applied on the board in order to protect the electroless or electrical copper plating layer from etching, which causes the process to be highly expensive. It will be understood that the printed wiring boards produced by the above process have been used only for high quality precision instruments such as industrial instruments, and not for application to livelihood instruments such as radio, television, or the like.

It is well known that after forming metal foil circuit layers by etching at both sides of the laminate, there are punched at required points of the laminate, holes through which electrically conductive paints are poured so as to connect the metal foil circuit layers. The laminate, however, has the thickness of more than 0.5 mm enough to also serve as a substrate of electronic devices. Accordingly, it is impossible to use a common screen printing process to flow the electrically conductive paints through the punched holes in the laminate of more than 0.5 mm thickness so as to connect the metal foil circuit layers on both sides of the laminate. Thus, there is required means to forcefully flow the electrically conductive paints through the punched holes by applying an air pressure or an evacuation at one of the sides of the laminate, for example. As a result, the effectiveness of production has been lowered and there is little reliability in the connection of both metal foil circuit layers.

SUMMARY OF THE INVENTION

Accordingly, it is a principal object of the invention to provide a printed wiring board made by a process utilizing two electrically conductive circuit layers on both sides of an insulating laminate wherein the connection of the circuit layers can be positively made by a simple process.

It is another object of the invention to provide a printed wiring board having electrically conductive circuit layers on both sides of an insulating laminate wherein no higher technology is required for connecting both circuit layers to each other.

It is a further object of the invention to provide a printed wiring board having electrically conductive layers on both sides of an insulating laminate which is suitable for mass production.

It is another object of the invention to provide a printed wiring board having electrically conductive circuit layers on both sides of an insulating laminate wherein the connection of the circuit layers can be positively accomplished.

In accordance with one aspect of the invention, there is provided a printed wiring board having two electrically conductive circuit layers on an insulating laminate, the board made by a process comprising the steps of preparing a first insulating layer having a thickness of 0.01 to 0.5 mm and having metal foils provided on both sides of said first insulating layer; forming metal foil circuit layers of predetermined pattern by treating said metal foils by printing and etching; forming through holes for connecting said metal foil circuit layers to each other; providing an electrically conductive member in said through holes so as to connect said metal foil circuit layers on both sides of said first insulating layer to each other; and thereafter attaching a second insulating layer to said first insulating layer so as to form said insulating laminate of desired thickness.

In accordance with another aspect of the invention, there is provided a printed wiring board having two electrically conductive circuit layers on an insulating laminate, characterized in that said insulating laminate comprises a first insulating layer having a thickness of 0.01 to 0.5 mm and a second insulating layer attached to said first insulating layer so as to form said insulating laminate having a desired thickness, and in that said electrically conductive circuit layers are provided on both sides of said first insulating layer.

BRIEF DESCRIPTION OF THE DRAWING

The above and other objects and features of the invention will be apparent from the description of the embodiments taken with reference to the accompanying drawing, in which:

FIG. 1 is a sectional view of a first insulating layer having metal foils provided on both sides of the insulating layer;

FIG. 2 is a sectional view of the first insulating layer of FIG. 1 after the metal foils are treated so as to form metal foil circuit layers by printing and etching;

FIG. 3 is a sectional view of the first insulating layer of FIG. 2 after through holes are formed in the insulating layer and the metal foils;

FIGS. 4A and 4B illustrate electrically conductive materials provided in the through holes in the first insulating layer and the metal foils;

FIGS. 5A and 5B sectionally illustrate a second insulating layer attached to the first insulating layers of FIGS. 4A and 4B, respectively;

FIGS. 6A and 6B sectionally illustrate printed wiring boards produced in accordance with the invention; and FIG. 7 is a sectional view of a modification.

DETAILED DESCRIPTION OF THE EMBODIMENTS

Referring now to FIG. 1, there is shown a first insulating layer 10 having a thickness of 0.01 to 0.5 mm and having metal foils 12 and 12' such as copper foils provided on both sides of the first insulating layer 10. The metal foils 12 and 12' are treated by a common process of printing and etching to form upper (front) and lower (back) metal foil circuit layers 14 and 14' having the form of predetermined pattern as shown in FIG. 2. Thereafter, as shown in FIG. 3, through holes 16, only one of which is shown in this figure, are formed in the first insulating layer 10 by drilling or punching. The through holes 16 serve to place an electrically conductive member therein to connect the upper and lower metal foil circuit layers 14 and 14' as described hereinjustbelow.

Next, as shown in FIGS. 4A and 4B, electrically conductive members 18 are placed in the through holes 16 so as to connect the upper and lower metal foil circuit layers 14 and 14'. In FIG. 4A, the electrically conductive members 18 comprise a solder or electrically conductive paint which is filled in the through holes 16 as well as attached to the upper and lower metal foil circuit layers 14 and 14' at their portions surrounding the through holes 16. In FIG. 4B, the electrically conductive members 18 comprise a metal layer which is formed on the wall of the through holes as well as on the upper and lower metal foil circuit layers 14 and 14' at their portions surrounding the through holes 16 by electroless plating. Thus, it will be understood that the metal foil circuits on both sides of the first insulating layer 10, which are connected to each other, are completed.

Thereafter, a second insulating layer 20 is attached to the first insulating layer 10 on the side of the lower metal foil circuit layer 14' so as to form an insulating laminate of predetermined thickness as a whole, as shown in FIGS. 5A and 5B. Thus, it will be noted that the whole insulating laminate has the thickness enough to provide a physical strength thereto and that various devices can be mounted thereon. Through holes 22 may be formed by drilling or by punching through the first and second insulating layers 10 and 20 across the metal foil circuit layer 14.

The metal foils 12 and 12' may be formed of copper, nickel, or the like. The thickness of the metal foil 12 may be normally 35 microns or more or less, while that of the metal foil 12' may be preferably 70 microns or more or less in view of provision of the increased contact area of the metal foil 12' and the electrically conductive members 18.

The first insulating layer 10 may be formed of cloth, paper, non-woven fabric, or the like impregnated with a thermosetting resin such as phenol-resin, polyester resin, epoxy resin, and so on. It should be noted that the first insulating layer 10 essentially has the thickness of 0.01 to 0.5 mm as defined before. If the thickness of the first insulating layer 10 is less than 0.01 mm. the electric property of the printed wiring board to be manufactured becomes lower and also it may have an undesirable pin-hole or pin-holes formed therein, which causes the upper and lower metal foil circuit layers 14 and 14' to become conductive at points other than predetermined points. If the thickness of the first insulating layer 10 is more than 0.5 mm, then it is difficult to provide the electrically conductive members 18 in the through holes 16 so as to positively connect the upper and lower metal foil circuit layers 14 and 14'. More particularly, the melted solder which is used in a roll soldering method and the electrically conductive paint which is used in a screen printing method, when filled in the through holes 16, cannot reliably reach the lower metal foil circuit layer 14'. Otherwise, the electroless metal plating layer of FIG. 4B, when applied to the wall of the through holes 16, will reach the lower metal foil circuit layer 14', but it has no reliance of conduction between the circuit layers as described in connection with the prior art and, in addition, it should be applied together with the electrical metal plating layer in view of the physical ductility of the metal plating layer, which causes the procedure to become complicated and expensive.

The through holes 16 may be formed either by drilling or by punching. It should be noted that the smear which tends to be formed during drilling or punching the first insulating layer 10 together with the metal foil circuit layers 14 and 14' is preferably removed before the electrically conductive members 18 are provided in the through holes 16.

As aforementioned, the electrically conductive members 18 may be applied either by rolling a melted solder so as to forcefully insert it into the through holes 16, or by filling an electrically conductive paint into the through holes 16 by means of a conventional screen printing method. Since the first insulating layer 10 has the thickness of 0.01 to 0.5 mm as aforementioned, the electrically conductive members 18 can be positively applied by such methods to the wall of the through holes 16 so as to connect the upper and lower metal foil circuit layers 14 and 14' to each other. Otherwise, the electrically conductive members 18 may be composed of electroless metal plating layer, FIG. 4B, such as copper plating layer or nickel plating layer having an approximate thickness of 10 microns, which permits the circuit layers 14 and 14' to be positively connected to each other.

The second insulating layer 20 may be formed of a commercially available thermosetting resin laminate. This laminate may be bonded directly to the first insulating layer 10 on its side having the metal foil circuit layer 14'. Alternatively, the second insulating layer 20 may be composed of thermosetting resin-impregnated sheet materials, which are placed on the first insulating layer 10 on the side thereof having the metal foil circuit layer 14' and then heated and pressurized by a press together with the first insulating layer 10 so as to form the insulating layer 20 at the same time that it is attached to the metal foil circuit layer 14'. It will be noted that, in this case, the upper metal foil circuit layer 14 is partially embedded in the first insulating layer 10. With sufficient heat and pressure, FIG. 7 shows that material from the second insulating layer 20 fully fills in the through holes 16 during the heating and pressurizing in a press. This prevents breakage of the electrically conductive member 18 which otherwise tends to occur due to expansion and contraction of the insulating layers 10 and 20.

Some examples of the invention will be described hereinjustbelow.

EXAMPLE I

A first insulating layer of epoxy resin-impregnated glass cloth of 0.1 mm thickness, having copper foils stuck thereto, one of which was of 35 microns thickness and the other of which was of 70 microns thickness, was prepared and treated so that metal foil circuit layers of predetermined wiring pattern were formed by a conventional method of printing and etching. Through holes having the diameter of 1.0 mm were then formed in the first insulating layer at the points of connection of the upper and lower metal foil circuit layers. Melted solder was forcefully inserted into the through holes by rolling it, so that the upper and lower metal foil circuit layers were connected to each other. Thereafter, seven-ply, epoxy resin-impregnated, glass cloth materials were lapped one over another and placed on the first insulating layer on its side having the metal foil circuit layer of 70 microns thickness. They were placed in a press and heated and pressurized by the press under the condition of a temperature of 170° C. and of a pressure of 50 Kg/cm$^2$ so as to produce a printed wiring board of 1.6 mm thickness. Finally, holes of 1.0 mm diameter which serve to mount devices were formed in the board by drilling.

Even though the thus-produced printed wiring board was subject to a thermal shock test at 50 cycles, at each of which it was steeped in an oil bath of 260° C. for five seconds, there was found no change in resistance to conduction of the metal foil circuit layers. Thus, it will be noted that the condition of the metal foil circuit layers is maintained intact.

EXAMPLE II

A first insulating layer of epoxy resin-impregnated glass cloth of 0.1 mm thickness having copper foils stuck thereto, one of which was of 35 microns thickness and the other of which was of 70 microns thickness, was prepared and treated in the same manner as described in Example I to obtain a body of printed wiring board. Through holes having the diameter of 1.0 mm were formed in the first insulating layer by punching and, after that, electrically conductive paint, which consisted of synthetic resin vehicle and silver powder combined therewith, was filled in the through holes by means of a screen printing method so as to connect the metal foil circuit layers to each other. Thereafter, seven-ply, epoxy resin-impregnated glass, non-woven cloth materials as a second insulating layer were lapped one over another and placed on the first insulating layer on its side having the metal foil circuit layer of 70 microns thickness. They were placed in a press and heated and pressurized by the press under the condition of a temperature of 170° and of a pressure of 40 Kg/cm$^2$ so as to produce a printed wiring board of 1.6 mm thickness. Finally, holes of 1.0 mm diameter which serve to mount devices were formed in the board by punching.

The same thermal shock test as in Example I was made of the thus-produced printed wiring board, in which there was found no change in the conduction of the metal foil circuit layers.

EXAMPLE III

The first insulating layer having the metal foil circuit layers formed in the same manner as in Example II was punched to form through holes of 1.0 mm diameter. Thereafter, it was steeped in a bath of a mixture of hydrofluoric acid and sulfuric acid to remove the smear of the through holes, then cleaned by trichloroethylene and dried. Next, electroless copper plating layers having a thickness of 10 microns were applied to the wall of the through holes in a conventional manner, to electrically connect the metal foil circuit layers to each other. Thereafter, seven-ply, epoxy resin-impregnated, glass non-woven cloth materials each having the thickness of 1.4 mm as a second insulating layer were lapped one over another, placed in a press and heated and pressurized by the press under the condition of a temperature of 170° C. and of a pressure of 40 Kg/cm$^2$ to produce a printed wiring board of 1.6 mm thickness. Finally, holes of 1.0 mm which serve to mount devices were formed in the board by punching.

The same thermal shock test as in Example I was made of the thus-produced printed wiring board, in which there was found no change in the condition of the metal foil circuit layers.

Although some embodiments of the invention have been described with reference to the accompanying drawing, it will be understood that they are by example, and that various changes and modifications may be made without departing from the spirit and scope of the invention, which is intended to be defined only by the appended claims.

What is claimed is:

1. A printed wiring board having first and second electrically conductive circuit layers on an insulating laminate, characterized in that said insulating laminate comprises a first insulating layer having a thickness of 0.01 to 0.5 mm and a second insulating layer attached to said first insulating layer so as to have a desired thickness, first and second metal foil circuit layers being provided on opposite sides of said first insulating layer, a surface defining an aperture through only said first insulating layer, a hollow tubular conductor in said aperture electrically interconnecting at least a part of said first metal foil circuit layer with at least a part of said second metal foil circuit layer, an insulator within said hollow tubular conductor, device mounting through holes through both of said insulating layers and separate from said hollow tubular conductor, and insulating material integral with said second insulating layer and completely filling said central aperture of said hollow tubular conductor to inhibit breakage of the conductor material of said hollow tubular conductor.

2. A printed wiring board as set forth in claim 1, and wherein said first insulating layer comprises thermosetting resin-impregnated paper sheet.

3. A printed wiring board as set forth in claim 1, and wherein said first insulating layer comprises thermosetting resin-impregnated glass cloth.

4. A printed wiring board as set forth in claim 1, and wherein said first insulating layer comprises thermosetting resin-impregnated glass non-woven fabric.

5. A printed wiring board as set forth in claim 1, and wherein said second insulating layer comprises thermosetting resin-impregnated multi-ply paper sheet.

6. A printed wiring board as set forth in claim 1, and wherein said second insulating layer comprises thermosetting resin-impregnated multi-ply glass cloth.

7. A printed wiring board as set forth in claim 1, and wherein said second insulating layer comprises thermosetting resin-impregnated multi-ply glass non-woven fabric.

* * * * *